(12) United States Patent
Xi

(10) Patent No.: US 12,315,463 B2
(45) Date of Patent: May 27, 2025

(54) DISPLAY PANEL, DRIVING METHOD FOR THE SAME, AND DISPLAY APPARATUS

(71) Applicant: Wuhan Tianma Microelectronics Co., Ltd., Wuhan (CN)

(72) Inventor: Suping Xi, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 18/782,699

(22) Filed: Jul. 24, 2024

(65) Prior Publication Data

US 2024/0379067 A1    Nov. 14, 2024

(51) Int. Cl.
  *G09G 5/00* (2006.01)
  *G09G 3/3275* (2016.01)
  *H10K 59/131* (2023.01)

(52) U.S. Cl.
  CPC ....... *G09G 3/3275* (2013.01); *H10K 59/1315* (2023.02); *G09G 2300/0426* (2013.01); *G09G 2310/0297* (2013.01); *G09G 2310/08* (2013.01); *G09G 2320/0209* (2013.01); *G09G 2330/021* (2013.01)

(58) Field of Classification Search
  CPC ... G09G 2300/0426; G09G 2310/0297; G09G 2310/08; G09G 2320/0209; G09G 2330/021; G09G 3/3233; G09G 3/3275; H10K 59/131; H10K 59/1315
  See application file for complete search history.

(56) References Cited

U.S. PATENT DOCUMENTS

| | | | |
|---|---|---|---|
| 2018/0358236 A1* | 12/2018 | Arae | H10D 30/6729 |
| 2021/0247634 A1* | 8/2021 | Chen | G02F 1/1345 |

FOREIGN PATENT DOCUMENTS

| | | |
|---|---|---|
| CN | 110277064 B | 1/2021 |
| CN | 114582284 A | 6/2022 |
| CN | 216749141 U | 6/2022 |
| CN | 111369931 B | 11/2022 |

* cited by examiner

*Primary Examiner* — Insa Sadio
(74) *Attorney, Agent, or Firm* — Tarolli, Sundheim, Covell & Tummino LLP

(57) ABSTRACT

A display panel, driving method for the same and display apparatus. An input terminal and output terminals of a demultiplexer are coupled to a data terminal and at least two data lines, respectively; one transistor is connected to one corresponding data line, the data line connected to a first transistor and the data line connected to a second transistor is coupled to a plurality of first sub-pixels and a plurality of second and/or third sub-pixels, respectively; a control terminal of the first transistor is coupled to a first control line, and a control terminal of the second transistor is coupled to a second control line; the first control line includes a first wiring section, which is greater than the second control line in line width; and/or the first wiring section includes a first and second sub-wiring arranged in different layers and connected with each other by at least two vias.

16 Claims, 9 Drawing Sheets

DISPLAY PANEL, DRIVING METHOD FOR THE SAME, AND DISPLAY APPARATUS

CROSS-REFERENCE TO RELATED APPLICATION

The present application claims priority to Chinese Patent Application No. 202410205037.1, filed on Feb. 23, 2024, the content of which is incorporated herein by reference in its entirety.

TECHNICAL FIELD

The present disclosure relates to the field of display technology and, in particular, to a display panel, a driving method for a display panel, and a display apparatus.

BACKGROUND

Organic Light-Emitting Diode (OLED) has a self-luminous characteristic, and its application in the display field makes display panels thin and light and have high brightness, low power consumption, fast response, high definition, good flexibility, and high luminous efficiency, which can meet the new demand of consumers for display technology. At present, display panels have problems such as line crosstalk, first frame brightness, residual shadow, power consumption, etc., which affect the performance of the display panels.

SUMMARY

Embodiments of the present disclosure provide a display panel, a driving method for a display panel, and a display apparatus, to solve the technical problems of improving the display effect of a display panel and reducing the power consumption.

In a first aspect, an embodiment of the present disclosure provides a display panel including: data lines, sub-pixels, demultiplexers, data terminals, and control lines; where the sub-pixels include first sub-pixels, second sub-pixels, and third sub-pixels which are different from each other in color, and the data lines are coupled to a plurality of the sub-pixels;

an input terminal of each demultiplexer is coupled to one of the data terminals, and output terminals of each demultiplexer are coupled to n data lines of the data lines, where n is a positive integer and n≥2; each demultiplexer includes n transistors, each transistor is connected between the input terminal and one of the output terminals of the demultiplexer, and one transistor is connected to one corresponding data line, and a control terminal of each transistor is coupled to one of the control lines; and the n transistors include first transistors and second transistors, the data lines connected to the first transistors are coupled to a plurality of the first sub-pixels, and the data lines connected to the second transistors are coupled to a plurality of the second sub-pixels and/or a plurality of the third sub-pixels; the control lines include first control lines and second control lines, the control terminal of each first transistor is coupled to one first control line, and the control terminal of each second transistor is coupled to one second control line; and where each first control line includes a first wiring section;

a line width of the first wiring section is greater than a line width of each second control line; and/or the first wiring section includes a first sub-wiring and a second sub-wiring arranged in different layers, and the first sub-wiring and the second sub-wiring are connected with each other by at least two vias.

In a second aspect, based on the same inventive concept, an embodiment of the present disclosure provides a driving method for a display panel. The display panel includes: data lines, sub-pixels, demultiplexers, data terminals, and control lines; where the sub-pixels include first sub-pixels, second sub-pixels, and third sub-pixels which are different from each other in color, and the data lines are coupled to a plurality of the sub-pixels; an input terminal of each demultiplexer is coupled to one of the data terminals, and output terminals of each demultiplexer are coupled to n data lines of the data lines, where n is a positive integer and n≥2; each demultiplexer includes n transistors, each transistor is connected between the input terminal and one of the output terminals of the demultiplexer, and one transistor is connected to one corresponding data line, and a control terminal of each transistor is coupled to one of the control lines; and the n transistors include first transistors and second transistors, the data lines connected to the first transistors are coupled to a plurality of the first sub-pixels, and the data lines connected to the second transistors are coupled to a plurality of the second sub-pixels and/or a plurality of the third sub-pixels; the control lines include first control lines and second control lines, the control terminal of each first transistor is coupled to one first control line, and the control terminal of each second transistor is coupled to one second control line;

the driving method includes:
  providing a first active level signal by one first control line to control one first transistor to be turned on;
  providing a second active level signal by one second control line to control one second transistor to be turned on; where an absolute value of a voltage value of the first active level signal is greater than an absolute value of a voltage value of the second active level signal.

In a third aspect, based on the same inventive concept, an embodiment of the present disclosure provides a display apparatus including the display panel provided in any embodiment of the present disclosure.

BRIEF DESCRIPTION OF DRAWINGS

To describe the technical solutions in the embodiments of the present disclosure or in the prior art more clearly, a brief description of the accompanying drawings that need to be used in the description of the embodiments or prior art will be given below. Apparently, the drawings in the following description show merely some embodiments of the present disclosure, and a person of ordinary skill in the art may still derive other drawings from these drawings without creative efforts.

DESCRIPTION OF EMBODIMENTS

Figure 1:
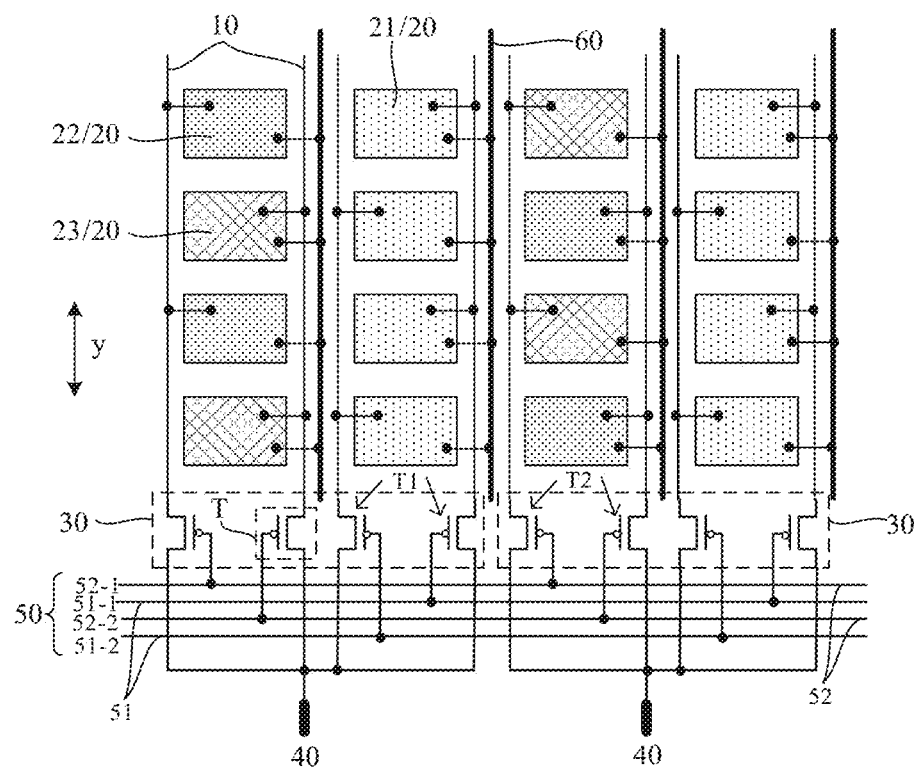
FIG. 1 is a schematic diagram of a display panel provided by an embodiment of the present disclosure.

To make the objectives, technical solutions, and advantages of the embodiments of the present disclosure more clear, the technical solutions in the embodiments of the present disclosure will be clearly and completely described below in conjunction with the accompanying drawings showing the embodiments of the present disclosure. The described embodiments are some rather than all of the embodiments of the present disclosure. All other embodiments obtained by those ordinarily skilled in the art based on the embodiments of the present disclosure without creative efforts should fall within the protection scope of the present disclosure.

Terms used in the embodiments of the present disclosure are only for the purpose of describing specific embodiments, and are not intended to limit the present disclosure. Unless otherwise indicated clearly in the context, words, such as "a", "the", and "this", in a singular form in the embodiments of the present disclosure and the appended claims comprise plural forms.

It should be understood that although the terms "first" and "second" may be used to describe XX in the embodiments of the present disclosure, these XXs should not be limited by these terms. These terms are merely used to distinguish the XXs from one other. For embodiment, a first XX can also be referred to as a second XX without departing from the scope of the embodiments of the present disclosure. Similarly, a second XX can also be referred to as a first XX.

In a related art, a data line is connected to a data terminal through a demultiplexer, and one demultiplexer is connected to at least two data lines. After being turned on, a transistor switch in the multiplexer connects the data terminal and the corresponding data line, and after the connection, the data terminal writes a data signal into the data line. When the transistor switch is turned off, the data line is in a floating state, and when the data line is in a floating state, its voltage signal is easily affected by coupling to generate fluctuation. If a direction of extension of a power supply line and a direction of extension of the data line are the same in a display area, there is a larger coupling effect between the power supply line and the data line. When the sub-pixels driven by the data line are switched from gray scale to black (i.e., to 0 gray scale), a voltage jump on the data line will cause a voltage jump on the power supply line, and the voltage jump on the power supply line will, in turn, affect the voltage on the data line. When the transistor switch is turned off and the data line is in the floating state, the voltage on the data line is easily affected by coupling to generate a fluctuation similar to the voltage on the power supply line, such a coupling effect between the data line and the power supply line is referred as the line crosstalk, the line crosstalk affects the data voltage and in turn affects the display effect. The display panel is also provided therein with scanning lines that intersect the data lines, and there is also line crosstalk between the scanning lines and the data lines. In addition, a pixel circuit operates with the drive transistor in a biased state for a long time, causing a threshold voltage of the drive transistor to drift, and the drift in the threshold voltage may cause the problem of smear to occur with the first frame display when a frame rate is switched or a picture is switched.

The dark-state voltage of the display panel is one of the key factors leading to the above problems. Therefore, the inventor considered improving the above technical problems by reducing the dark-state voltage of the display panel. In some implements, the structure of the display panel is improved, for example, the dark-state voltage of the display panel depends on the dark-state voltage of the first sub-pixel, and the first control line controlling the first transistor corresponding to the first sub-pixel (the transistor provided in the multi-distributor which is connected to the data line to which the first sub-pixel is connected) is designed so that the first transistor is turned on better by lowering the impedance of the first control line, and in turn makes the data voltage written into the first sub-pixel more sufficient, whereby the dark-state voltage of the first sub-pixel can be reduced, which in turn improves the problems of line crosstalk, display smear, and high power consumption of the display panel. In other implements, the driving method for a display panel is improved, such as by designing the magnitude of the voltage value of the control signal of the first transistor corresponding to the first sub-pixel, so that the first transistor is turned on better for a certain time, and the data voltage written into the first sub-pixel can be made more sufficient, whereby the dark-state voltage of the first sub-pixel can be reduced, and in turn it is possible to improve the problems of display smear, high power consumption, and line crosstalk when grey scale is switched to black of the display panel.

FIG. 1 is a schematic diagram of a display panel provided by an embodiment of the present disclosure. As shown in FIG. 1, the display panel includes data lines 10, sub-pixels 20, demultiplexers 30, data terminals 40, and control lines 50. The sub-pixels 20 include first sub-pixels 21, second sub-pixels 22, and third sub-pixels 23 which are different from each other in color. Each data line 10 extends along a first direction y and is coupled to multiple sub-pixels 20. The first sub-pixel 21, the second sub-pixel 22, and the third sub-pixel 23 are one of a red sub-pixel, a green sub-pixel, and a blue sub-pixel, respectively. Each sub-pixel 20 includes a light-emitting element and a pixel circuit. The pixel circuit is configured to drive the light-emitting element to emit light. The light-emitting element may be an organic light-emitting element.

Each demultiplexer 30 includes an input terminal coupled to one of the data terminals 40, and output terminals coupled to n data lines of the data lines 10, where n is a positive integer and n≥2. The demultiplexer 30 further includes n transistors T. Each transistor T is connected between the input terminal and one output terminal of the demultiplexer 30, and one transistor T is connected to one corresponding data line 10. A control terminal of the transistor T is coupled to the control line 50. FIG. 1 shows an example in which n=4. The transistor T may be a n-type transistor or may be a p-type transistor. In the example shown in FIG. 1, the transistor T is a p-type transistor. With the provision of the demultiplexers 30, it is possible to reduce the number of the data terminals 40 provided in the display panel and also to reduce the number of the pins provided in a display drive chip, whereby the manufacturing cost of the display drive chip can be reduced.

The n transistors T include first transistors T1 and second transistors T2. The data lines 10 connected to the first transistors T1 are coupled to a plurality of the first sub-pixels 21, and the data lines 10 connected to the second transistors T2 are coupled to a plurality of the second sub-pixels 22 and/or a plurality of the third sub-pixels 23. The control lines 50 include first control lines 51 and second control lines 52. A control terminal of the first transistor T1 is coupled to the first control line 51, and a control terminal of the second transistor T2 is coupled to the second control line 52.

The first control line 51 and the second control line 52 control the first transistor T1 and the second transistor T2, respectively. Each data terminal 40 is configured to supply a data signal to the data lines 10 through the demultiplexer 30. Each first control line 51 provides an enable signal to control one first transistor T1 to be turned on, and the data terminal 40 writes a data signal into the data line 10 coupled to the first transistor T1, and each second control line 52 provides an enable signal to control one second transistor T2 to be turned on, and the data terminal 40 writes a data signal into the data line 10 coupled to the second transistor T2. During the display driving, the n transistors T in one demultiplexer 30 each are turned on at different moments to charge the n data lines 10 in a time division manner.

Figure 2:
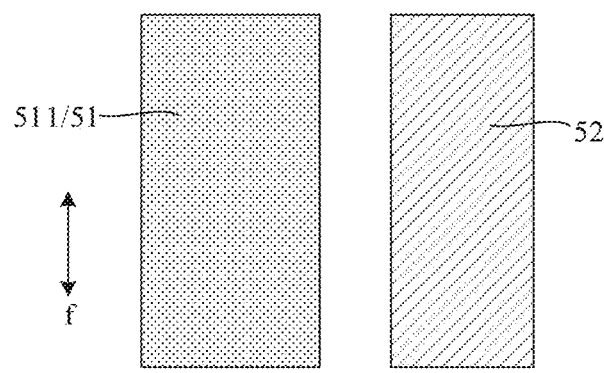
FIG. 2 is a partial schematic diagram of the display panel provided by the embodiment of the present disclosure.

In some implements, FIG. 2 is a partial schematic diagram of a display panel provided by an embodiment of the present disclosure, and FIG. 2 is only a simplified schematic to illustrate the wiring layout of the control lines. As shown in FIG. 2, a direction f is the direction of extension of the first control line 51 and the second control line 52 at the localized location. The first control line 51 includes a first wiring section 511, and a line width of the first wiring section 511 is greater than a line width of the second control line 52. The line width refers to the width of the wiring along a direction perpendicular to the direction of extension of the wiring. The first control line 51 and the second control line 52 are made of a same material. According to the law of resistance, the resistance of the first wiring section 511 may be reduced by setting the line width of the first wiring section 511 to be lager, thereby being conducive to reducing the impedance of the first control line 51.

Figure 3:
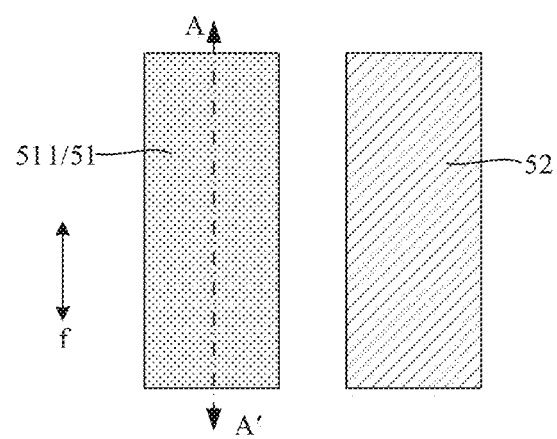
FIG. 3 is a partial schematic diagram of another display panel provided by an embodiment of the present disclosure.
Figure 4:
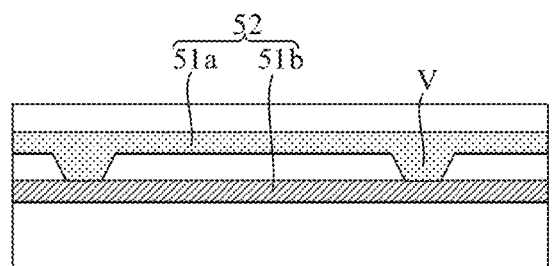
FIG. 4 is a cross-sectional view taken along line A-A' in FIG. 3.

In other implements, FIG. 3 is a partial schematic diagram of another display panel provided by an embodiment of the present disclosure, and FIG. 3 is also only a simplified schematic to illustrate the wiring layout of the control lines. FIG. 4 is a cross-sectional view taken along line A-A' in FIG. 3. In conjunction with FIG. 3 and FIG. 4, the first control line 51 includes a first wiring section 511, and the first wiring section 511 includes a first sub-wiring 51a and a second sub-wiring 51b arranged in different layers. The first sub-wiring 51a and the second sub-wiring 51b are connected to each other through at least two vias V penetrating through an insulation layer. That is, the first sub-wiring 51a and the second sub-wiring 51b are connected in parallel. Optionally, the second control line 52 is formed in a same layer as the first sub-wiring 51a or the second sub-wiring 51b. By providing the first wiring section 511 to include the sub-wirings connected in parallel, the resistance of the first wiring section 511 can be reduced, thereby being conducive to reducing the impedance of the first control line 51. In some implements, the first wiring section 511 may be a three-layer wiring or a multi-layer wiring. When the first wiring section 511 is a three-layer wiring, three sub-wirings located in three metal layers are connected in parallel.

In further implements, the first control line 51 includes a first wiring section 511, the first wiring section 511 includes a first sub-wiring 51a and a second sub-wiring 51b connected in parallel, and a line width of the first sub-wiring 51a and/or a line width of the second sub-wiring 51b is greater than a line width of the second control line 52. The impedance of the first control line 51 is reduced by increasing the line width(s) and providing the sub-wirings connected in parallel.

In the display panel, the first sub-pixel 21, the second sub-pixel 22, and the third sub-pixel 23 have different light-emitting colors and different light-emitting efficiencies. The higher the light emitting efficiency of the sub-pixel 20, the greater the voltage required for the sub-pixel 20 to display a black state. However, a uniform dark-state voltage needs to be set for the sub-pixels 20 of the three colors in the display panel, the dark-state voltage of the display panel depends largely on the dark-state voltage of the sub-pixel 20 with the largest light emitting efficiency. When the first sub-pixel 21 has the largest light emitting efficiency among the sub-pixels 20 of the three colors, the dark-state voltage of the display panel depends on the voltage required for the first sub-pixel 21 to display the black state. In some implements, the voltage required for the green sub-pixel to display the black state is largest among the red, green, and blue sub-pixels, and thus the dark-state voltage of the green sub-pixel is set to be the dark-state voltage of the display panel. In some embodiments, the first sub-pixel 21 is the green sub-pixel, one of the second sub-pixel 22 and the third sub-pixel 23 is the red sub-pixel, and the other of the second sub-pixel 22 and the third sub-pixel 23 is the blue sub-pixel.

The embodiments of the present disclosure can reduce the impedance of the first control line 51, and thus the voltage drop of the voltage signal on the first control line 51 is reduced, which can make the first transistor T1 turned on better. When the first transistor T1 is turned on to write a data voltage to the data line 10 connected to the first sub-pixels 21, the data voltage is written more sufficiently, and an actual data voltage written is closer to a preset data voltage, whereby the preset data voltage required for the first sub-pixel 21 to reach the dark-state can be reduced. When the dark-state voltage of the display panel depends on the voltage required for the first sub-pixel 21 to display the black state (that is, the dark-state voltage of the first sub-pixel 21), the dark-state voltage of the display panel can be reduced by reducing the dark-state voltage of the first sub-pixel 21. As shown in FIG. 1, the display panel further includes power supply lines 60 extending along a same direction as the data lines 10. One power supply line 60 is coupled to multiple sub-pixels 20. A large coupling effect exists between the data lines 10 and the power supply lines 60. It is noted that, in order to distinguish the data lines 10 from the power supply lines 60, in FIG. 1, the power supply lines 60 are illustrated with black thick lines, and the data lines are illustrated with black thin lines, which does not indicate the actual relationship between the thicknesses and sizes of these two kinds of lines. After the dark-state voltage of the display panel is reduced, when the grey scale of the sub-pixels 20 driven by the data line 10 is switched to black, the amplitude of jump of the voltage on the data line 10 is reduced, and thus the fluctuation of the voltage on the power supply line 60 caused by the coupling effect of the data line 10 is reduced. After the transistor T connected to the data line 10 are turned off, the data line 10 is in a floating state, the fluctuation of the voltage on the power supply line 60 in turn has a smaller influence on the voltage on the data line 10, thereby reducing the line crosstalk between the data line 10 and the power supply line 60, and improving the display effect. With the designs of the embodiments of the present disclosure, it is also possible to reduce the line crosstalk between the data line 10 and other signal line (for example, the power supply line and scan line).

Moreover, the embodiments of the present disclosure can reduce the dark-state voltage of the display panel, and also can reduce a power supply voltage provided by the display drive chip to the display panel, whereby the power consumption can be reduced. In yet another aspect, a drive transistor in the pixel circuit operating in a biased state for a long time may cause a threshold voltage of the drive transistor to drift. The drift amount of the threshold voltage can be reduced by reducing the dark-state voltage, thereby being able to improve the display brightness of the first frame when a frame rate is switched or a picture is switched, improving the problem of image smear. In yet another aspect, the first transistor T1 is turned on better, such that the data voltage is more sufficiently written into the data line 10 connected to the first sub-pixels 21, and thus the grey scale displayed by the first sub-pixels 21 is more accurate. When the first sub-pixel 21 is a sub-pixel of the three sub-pixels 20 that has the highest percentage of brightness when they cooperate to emit white light, for example, when the first sub-pixel 21 is a green sub-pixel, the visual effect of the low gray scale display can also be enhanced.

A non-display region of the display panel is provided therein with complicated lines, including the demultiplexers, a positive power supply bus, a negative power supply bus, and the like. The display panel has a limited number of metal layers. The lines arranged in the non-display region and positioned in different metal layers may overlap and be insulated from one another, and a parasitic capacitance may exist at a position where the wirings overlap one another. For example, it is illustrated in FIG. 1 that the control line 50 may overlap a line connected between the data terminal 40 and the transistor T in the demultiplexer 30. In addition, according to the line layout in the non-display region, the control line 50 may also overlap the positive power supply bus or the negative power supply bus, whereby the control line 50 is caused to have a large parasitic capacitance thereon. The present disclosure further contemplates a solution for reducing the parasitic capacitance on the first control line 51, whereby the impedance of the first control line 51 is further reduced.

Figure 5A:
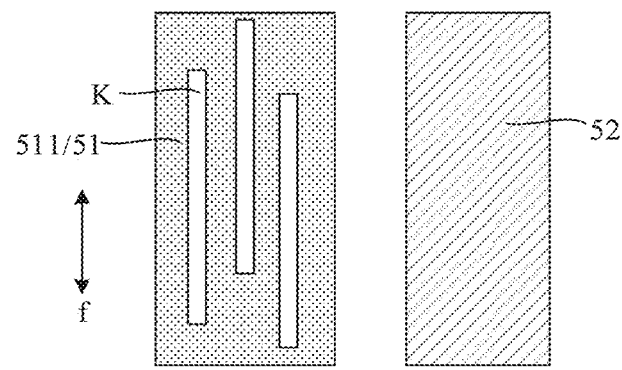
FIG. 5A is a partial schematic diagram of another display panel provided by an embodiment of the present disclosure.

In some implements, FIG. 5A is a partial schematic diagram of another display panel provided by an embodiment of the present disclosure. As shown in FIG. 5A, the first wiring section 511 includes at least one hollow out portion K. The hollow out portion K runs through the first wiring section 511. By setting the line width of the first wiring section 511 to be greater than the line width of the second control line 52, it is possible to reduce the resistance of the first control line 51. Meanwhile, by providing the hollow out portion K on the first wiring section 511, it is also possible to reduce the parasitic capacitance, whereby the impedance of the first control line 51 is further reduced.

Figure 5B:
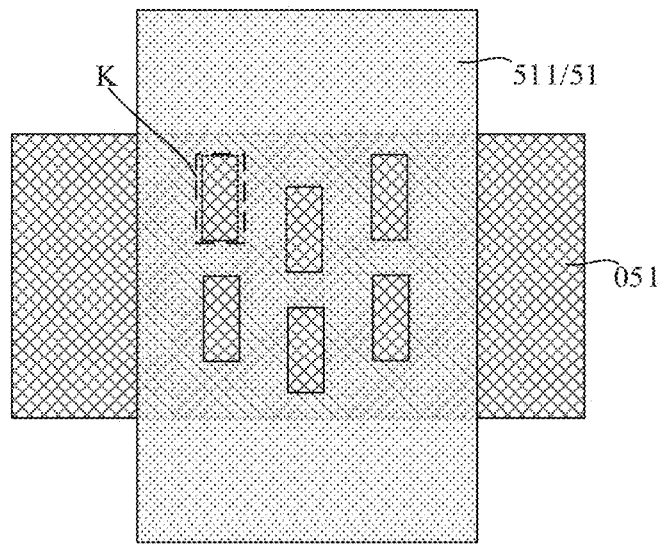
FIG. 5B is a partial schematic diagram of another display panel provided by an embodiment of the present disclosure.

FIG. 5B is a partial schematic diagram of another display panel provided by an embodiment of the present disclosure, and FIG. 5B illustrates the first wiring section 511 of the first control line 51 and a signal line 051 overlapping the first wiring section 511 in a simplified manner. The signal line 051 may be the line connected between the data terminal 40 and the transistor T in the demultiplexer 30, or may also be the positive power supply bus or the negative power supply bus. The signal line 051 may extend along a same direction as the first wiring section 511 or may also extend along a different direction from the first wiring section 511. Since the first wiring section 511 overlaps and is insulated from the signal line 051, a parallel-plate capacitor, i.e., a parasitic capacitance, is formed at the overlapping position between the signal line 051 and the first wiring section 511. The capacitance formula of the parallel-plate capacitor is $C=(\varepsilon S)/4\pi k d$, where $\varepsilon$ is a dielectric coefficient of a dielectric material, k is an electrostatic force constant, S is a facing area of two plates of the capacitor, and d is a vertical distance between the two plates. According to the capacitance formula of the parallel-plate capacitor, it can be seen that after the first wiring section 511 is provided with the hollow out portion K, the facing area between the first wiring section 511 and the signal line 051 is reduced, thereby causing the capacitance between the first wiring section 511 and the signal line 051 to be reduced.

In embodiments of the present disclosure, the first wiring section 511 overlaps and is insulated from the signal line 051, and the first wiring section 511 is provided with the hollow out portion K, which can reduce the parasitic capacitance of the first control line 51, thereby further reducing the impedance of the first control line 51. This in turn makes the data voltage written into the first sub-pixel 21 more sufficient, thereby reducing the dark-state voltage of the first sub-pixel 21, improving the problems of the display panel such as image smear, large power consumption, and the line crosstalk when the gray scale is switched to black.

Figure 6:
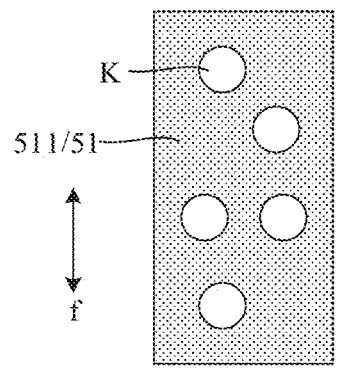
FIG. 6 is a schematic diagram of a first wiring section in another display panel provided by an embodiment of the present disclosure.

In FIG. 5A, the hollow out portion K is represented schematically only. When the first wiring section 511 is provided with a plurality of hollow out portions K, the plurality of hollow out portions K may be arranged regularly or irregularly. In some implements, FIG. 6 is a schematic diagram of a first wiring section in another display panel provided by an embodiment of the present disclosure. As shown in FIG. 6, the plurality of hollow out portions K of the first wiring section 511 are arranged irregularly. In FIG. 6, it is shown that the plurality of hollow out portions K are circular. Alternatively, the hollow out portions K may be rectangle, triangle, strip-shaped, and the like. The plurality of hollow out portions K of the first wiring section 511 may have a same shape or may have different shapes. In addition, by providing the plurality of hollow out portions K, it is possible to reduce the parasitic capacitance at multiple positions, which is conductive to reducing the impedance.

In some implements, as shown in FIG. 5A, the direction of extension of the hollow out portion K and the direction of extension of the first wiring section 511 are the same. That is, the hollow out portion K is an elongate hollow out portion. The elongate hollow out portion K is relatively easy to be formed, and it is easy to make the hollow out portion K with a relatively large area by a simple process.

In some implements, the first sub-wiring 51a includes at least one hollow out portion K, and/or the second sub-wiring 51b includes at least one hollow out portion K. The hollow out portion K of the first sub-wiring 51a penetrates through the film layer of the first sub-wiring 51a, and the hollow out portion K of the second sub-wiring 51b penetrates through the film layer of the second sub-wiring 51b. In this implement, the first wiring section 511 is provided with sub-wirings connected in parallel to reduce the resistance of the wiring, while at least one sub-wiring is provided with the hollow out portion K. For example, the first wiring section 511 overlaps and is insulated from another signal line, the metal layer of this signal line and the metal layer of the first sub-wiring 51a are two adjacent metal layers, and the first sub-wiring 51a is provided with the hollow out portion K thereon, thereby reducing the parasitic capacitance between the first sub-wiring 51a and the signal line. That is, the parasitic capacitance of the first control line is reduced. In this way, it is possible to further reduce the impedance of the first control line 51, and in turn to make the data voltage written into the first sub-pixel 21 more sufficient, thereby reducing the dark-state voltage of the first sub-pixel 21, improving the problems of the display panel such as image smear, large power consumption, and the line crosstalk when the gray scale is switched to black.

Figure 7:
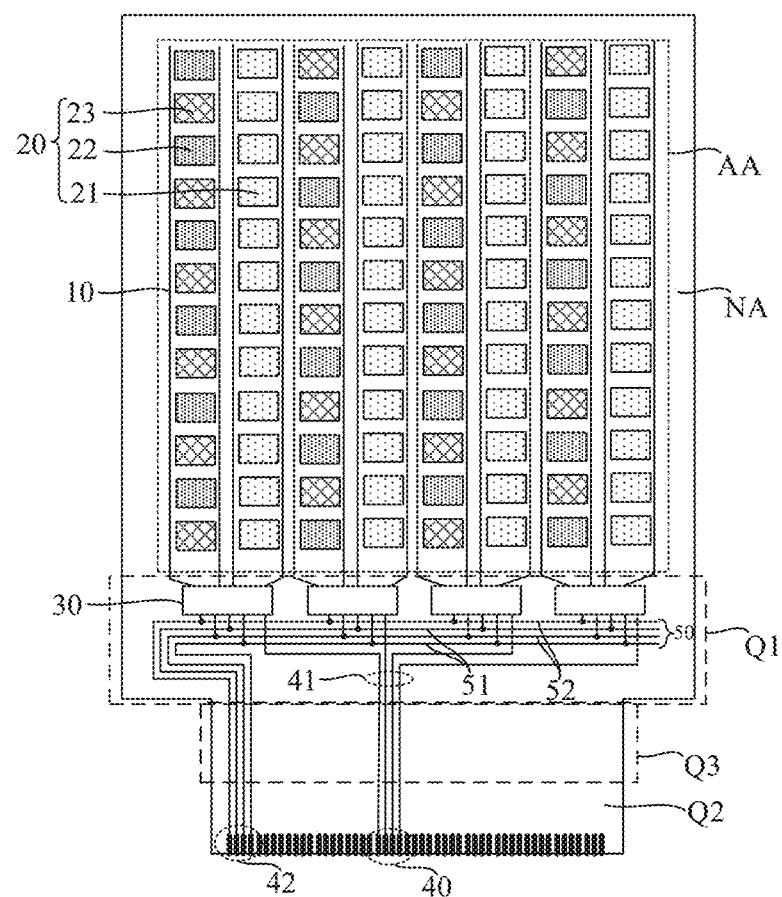
FIG. 7 is a schematic diagram of another display panel provided by an embodiment of the present disclosure.

In some implements, FIG. 7 is a schematic diagram of another display panel provided by an embodiment of the present disclosure. As shown in FIG. 7, the display panel includes a display region AA and a non-display region NA. The data lines 10 and the sub-pixels 20 are located in the display region AA. The non-display region NA includes a first area Q1, a bendable area Q3, and a second area Q2. The first area Q1 is adjacent to the display region AA. The bendable area Q3 is located on a side of the first area A1 away from the display region AA. The second area Q2 is located on a side of the bendable area Q3 away from the first area Q1. The demultiplexers 30 are located in the first area Q1, and the data terminals 40 are located in the second area Q2. A data transmission line 41 is connected to the data terminal 40, extends from the second area Q2 into the first area Q1 via the bendable area Q2, and then is connected to the input terminal of the demultiplexer 30. The control line 50 extends from the second area Q2 into the first area Q1. Optionally, as shown in FIG. 7, the signal terminals provided in the second area Q2 further include control signal terminals 42 coupled to the control lines 50. The signal terminals (including the data terminals 40 and the control signal terminals 42) in the second area Q2 are electrically connected to the display drive chip. Signals are provided to the corresponding signal terminals through the pins of the display driver chip to control the display of the display panel. In FIG. 7, the demultiplexer 30 is illustrated only in a simplified manner, and its structure can be understood with reference to FIG. 1. The display panel provided in this implement is provided with a bendable area Q3 in the non-display region NA, and the bendable area Q3 is capable of bending to place the second area Q2 on the backside of the display panel, which can be useful in narrowing the bezel and improving the visual experience in application.

In embodiments of the present disclosure, the line width of the first wiring section 511 is increased, or the first wiring section 511 is provided as a double/multi-layer wiring, thereby reducing the impedance of the first control line 51. In some implements, at least a part of the first wiring section 511 is located in the second area Q2. In application, after the bendable area Q3 is bent, the second area Q2 is placed on the backside of the display panel, the design of the first wiring section 511 may not affect the bezel of the display panel.

In the second area Q2, due to the limitations in the wiring space and the number of metal film layers, the first control line 51 may also have locations where it overlaps with other signal lines. At the locations where the first control line 51 overlaps with other signal lines A, the first control line 51 may be designed with the hollow out portion K, whereby the parasitic capacitance of the first control line 51 is reduced, and in turn the impedance of the first control line 51 is reduced.

The embodiments of the present disclosure are able to reduce the impedance of the first control line 51 by designing the first wiring section 511, whereby the first transistor T1 is turned on better. When the first transistor T1 is turned on, the data voltage written into the data line 10 connected to the first sub-pixels 21 is more sufficient, thereby reducing the dark-state voltage of the first sub-pixels 21. On this basis, an embodiment of the present disclosure further provides a solution for further reducing the dark-state voltage of the first sub-pixel 21. For example, the first transistor T1 can be turned on better by adjusting the width-to-length ratio of the first transistor T1, whereby the charging time of the data line connected to the first transistor T1 is increased and the data line is charged more sufficiently; for example, the voltage value of the active level signal on the first control line 51 is adjusted so that the first transistor T1 is turned on better, thereby further charging the data line connected to the first transistor T1 more sufficiently; for another example, the duration of the active level signal on the first control line 51 is adjusted to increase the turn-on time of the first transistor T1, and the charging time of the data line connected to the first transistor T1 is increased to charge the data line more sufficiently. The above solution will be described below by way of specific embodiments.

Figure 8:
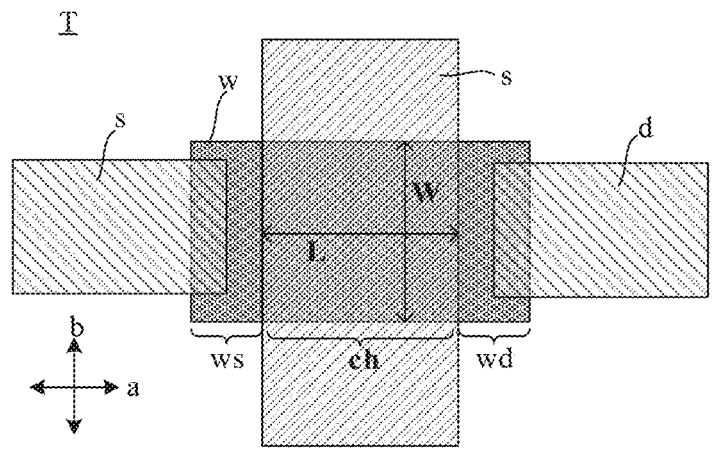
FIG. 8 is a simplified schematic diagram of a transistor structure.

FIG. 8 is a simplified schematic diagram of a transistor structure. As shown in FIG. 8, the transistor T includes a source s, a drain d, a gate s, and an active layer w. The active layer w includes a source region ws connected to the source s, and a drain region wd connected to the drain d. A region located between the source region ws and the drain region wd and overlapping the gate s forms a channel ch. Along a direction from the source region ws to the drain region wd, the length of the channel ch is the channel length L. Along a direction b, the length of the channel ch is the channel width W. The direction b is perpendicular to the direction a. W/L is the width-to-length ration of the transistor. In FIG. 8, it is shown that the source s and the source region ws are connected and contact with each other, and the drain d and the drain region wd are connected and contact with each other. In an actual display panel structure, the source s and the drain d may be connected to the source region WS and the drain region WD through the vias on the insulating layer, respectively.

In some implements of the present disclosure, the width-to-length ratio of the first transistor T1 is greater than the width-to-length ratio of the second transistor T2. It may be that the channel length of the first transistor T1 and the channel length of the second transistor T2 are the same, and the channel width of the first transistor T1 is greater than the channel width of the second transistor T2; it may be that the channel width of the first transistor T1 and the channel width of the second transistor T2 are the same, and the channel length of the first transistor T1 is less than the channel length of the second transistor T2; and it may also be that the channel length of the first transistor T1 and the channel length of the second transistor T2 are different, and the channel width of the first transistor T1 and the channel width of the second transistor T2 are also different. By setting the width-to-length ratio of the first transistor T1 to be larger, it is possible to make the first transistor T1 to be turned on better when the voltage value of the control signal is unchanged, which is capable of effectively reducing the duration of the rising edge and the duration of the falling edge of the control signal, thereby increasing the charging time of the data line connected to the first transistor T1, and making the charging of the data line more sufficient.

In prior art, the formula of the charging or discharging time of a capacitor is: $Vt=V0+(V1-V0)*[1-\exp(-t/RC)]$, where Vt is the required voltage, V0 is the initial voltage, V1 is the final voltage (namely, the predicted charging voltage), R is the resistance of the line, C is the capacitance, and t is the charging time. In the embodiments of the present disclosure, the process that after the transistor T is turned on, the data terminal 40 is connected to the data line 10 to write the data voltage into the data line 10 may be considered as a charging process of a line capacitor, and the formula of the charging or discharging time of the capacitor can be applied. Where Vt may be regarded as the voltage value of the data voltage actually written into the data line 10, V1 is the dark-state voltage, V0 is the initial voltage of the data line 10, and t is the charging time for charging by writing the data voltage into the data line 10. When charging the data line 30, the dark-state voltage V1 can be reduced assuming that Vt remains unchanged and the charging time t is increased. That is, by increasing the charging time for writing the data voltage into the data line 10, the voltage required for the sub-pixel to display the dark-state can be reduced accordingly. For the application in the embodiment of the present disclosure, by setting the width-length ratio of the first transistor T1 to be larger, it is possible to make the first transistor T1 to be turned on better when the voltage value of the control signal remains unchanged, thereby increasing the charging time of the data line connected to the first transistor T1, whereby the dark-state voltage of the first sub-pixel 21 can be further reduced.

Taking the display panel shown in FIG. 1 as an example, the transistors T in the demultiplexer 30 are p-type transistors, and the low level signal on the control line 50 is an active level signal. The control line 50 includes two first control lines 51 and two second control lines 52. The two first control lines 51 are respectively a first control line 51-1 and a first control line 51-2, and the two second control lines 52 are respectively a second control line 52-1 and a second control line 52-2.

Figure 9:
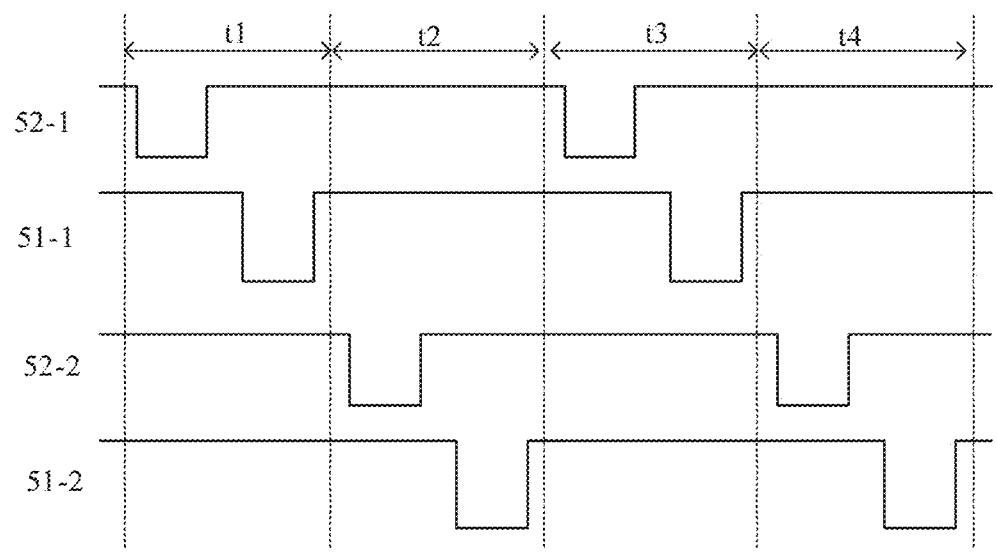
FIG. 9 is a timing diagram of a control signal provided by an embodiment of the present disclosure.

FIG. 9 is a timing diagram of a control signal provided by an embodiment of the present disclosure. The operating process of the demultiplexer 30 is described in conjunction with FIG. 1 and FIG. 9. FIG. 1 shows four sub-pixel rows, which are a first sub-pixel row, a second sub-pixel row, a third sub-pixel row, and a fourth sub-pixel row, from top to down, and t1 to t4 are time periods for writing the data voltages into the four sub-pixel rows, respectively.

In the time period t1 in which the data voltage is written into the first sub-pixel row: a second active level signal is provided by the second control line 52-1 to control the second transistors T2 connected to the second control line 52-1 to be turned on, the left data terminal 40 writes the data voltage into the data line 10 connected to the second transistor T2, the data line 10 writes the data voltage into the second sub-pixel 22, the right data terminal 40 writes the data voltage into the data line 10 connected to the second transistor T2, and the data line 10 writes the data voltage into the third sub-pixel 23; and a first active level signal is provided by the first control line 51-1 to control the first transistors T1 connected to the first control line 51-1 to be turned on, the left data terminal 40 writes the data voltage into the data line 10 connected to the first transistor T1, the data line 10 writes the data voltage into the first sub-pixel 21, the right data terminal 40 writes the data voltage into the data line 10 connected to the first transistor T1, and the data line 10 writes the data voltage into the first sub-pixel 21.

In the time period t2 in which the data voltage is written into the second sub-pixel row: a second active level signal is provided by the second control line 52-2 to control the second transistors T2 connected to the second control line 52-2 to be turned on, the left data terminal 40 writes the data voltage into the data line 10 connected to the second transistor T2, the data line 10 writes the data voltage into the third sub-pixel 23, the right data terminal 40 writes the data voltage into the data line 10 connected to the second transistor T2, and the data line 10 writes the data voltage into the second sub-pixel 22; and a first active level signal is provided by the first control line 51-2 to control the first transistors T1 connected to the first control line 51-2 to be turned on, the left data terminal 40 writes the data voltage into the data line 10 connected to the first transistor T1, the data line 10 writes the data voltage into the first sub-pixel 21, the right data terminal 40 writes the data voltage into the data line 10 connected to the first transistor T1, and the data line 10 writes the data voltage into the first sub-pixel 21.

The operating process of the demultiplexer 30 in the time period t3 is same as that in the time period t1, and the operating process of the demultiplexer 30 in the time period t4 is same as that in the time period t2. That is, in the two adjacent time periods in which the data voltage is written into two adjacent sub-pixel rows, each of the four transistors T in the demultiplexer 30 is turned on once in a different time period, and in the process of writing the data voltage into one sub-pixel row, one first transistor T1 and one second transistor T2 each are turned on once.

In some implements, the first control line 51 provides the first active level signal to control the first transistor T1 to be turned on, the second control line 52 provides the second active level signal to control the second transistor T2 to be turned on, and the absolute value of the voltage value of the first active level signal is greater than the absolute value of the voltage value of the second active level signal. As shown in FIG. 9, when the low level signal is the active level signal, both the first active level signal and the second active level signal are negative voltages, and the voltage value of the first active level signal provided by the first control line 51-1 (and the first control line 51-2) is less than the voltage value of the second active level signal provided by the second control line 52-1 (and the second control line 52-2), whereby it is possible to make the first transistor T1 turned on better, the data voltage written into the data line 10 connected to the first transistor T1 is more sufficient, whereby the dark-state voltage of the first sub-pixel 21 can be further reduced.

In further implements, the transistors T in the demultiplexer 30 are n-type transistors, and the control line 50 provides a high level signal as the active level signal. The first active level signal provided by the first control line 51 and the second active level signal provided by the second control line 52 are positive voltages. Accordingly, by setting the voltage value of the first active level signal to be greater than the voltage value of the second active level signal, it is possible to make the first transistor T1 turned on better, the data voltage written into the data line 10 connected to the first transistor T1 is more sufficient, whereby the dark-state voltage of the first sub-pixel 21 can be further reduced.

Figure 10:
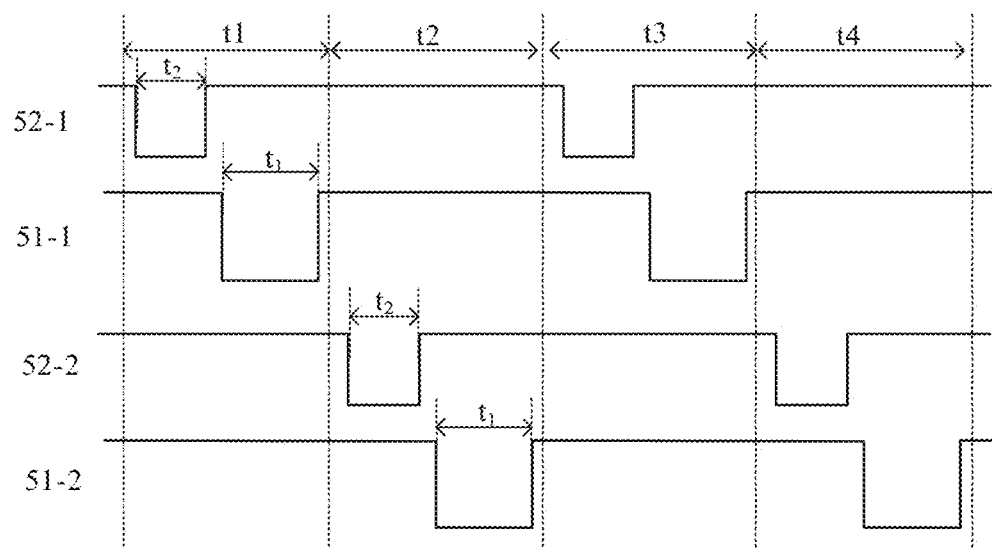
FIG. 10 is a timing diagram of another control signal provided by an embodiment of the present disclosure.

In some implements, FIG. 10 is a timing diagram of another control signal provided by an embodiment of the present disclosure. The timing diagram provided by the embodiment of FIG. 10 can be used to drive the embodiment of FIG. 1. The first control line 51 includes a first control line 51-1 and a first control line 51-2, and the second control line 52 includes a second control line 52-1 and a second control line 52-2. In conjunction with FIG. 1 and FIG. 10, the first control line 51 provides a first active level signal to control the first transistors T1 to be turned on, and the second control line 52 provides a second active level signal to control the second transistors T2 to be turned on; and the low level signals provided by the first control line 51 and the second control line 52 are the active level signals. The duration of the first active level signal is $t_1$, and the duration of the second active level signal is $t_2$, with $t_1 > t_2$. It has been illustrated in the above relevant principle that by increasing the charging time of the data line 10, it is possible to reduce the dark-state voltage of the sub-pixel connected to that data line 10. In the embodiment of the present disclosure, by increasing the duration of the active level signal provided by the first signal line 51, it is possible to increase the turn-on duration of the first transistors T1, and thus it is possible to increase the charging time of the data line 10 connected to the first transistor T1, and the data line 10 connected to the first transistor T1 is correspondingly connected to a plurality of the first sub-pixels 21, and thus it is possible to reduce the dark-state voltage of the first sub-pixels 21.

It should be noted that the above solutions for reducing the dark-state voltage of the first sub-pixel 21 provided by the embodiments of the present disclosure may be applied in combination under the condition that the technical features do not conflict, so that two or more technical solutions are applied in combination to reduce the dark-state voltage of the first sub-pixel 21, so that the dark-state voltage of the first sub-pixel 21 is reduced to a greater extent. When the dark-state voltage of the display panel depends on the dark-state voltage of the first sub-pixel 21, the dark-state voltage of the display panel can be greatly reduced, so that the problem of line crosstalk when the gray scale is switched to black can be improved by reducing the dark-state voltage of the display panel, and the power consumption can also be reduced. In addition, the display brightness of the first frame when the frame rate is switched or the picture is switched is improved, the problem of display smear is improved, and the visual effect of low-gray-scale display is improved.

Figure 11:
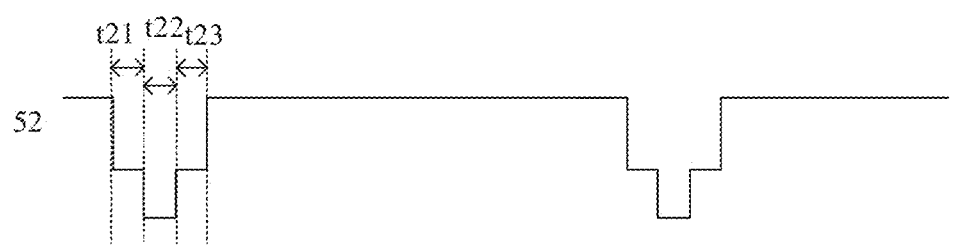
FIG. 11 is a timing diagram of yet another control signal provided by an embodiment of the present disclosure.

In further implements, the second control line 52 provides the second active level signal to control the second transistor T2 to be turned on. The time period in which the second control line 52 provides the second active level signal includes a first period, a second period, and a third period, the absolute value of the signal voltage value in the second time period is greater than the absolute value of the signal voltage value in the first time period, and the absolute value of the signal voltage value in the second time period is greater than the absolute value of the signal voltage value in the second time period. FIG. 11 is another control signal timing diagram provided by an embodiment of the present disclosure. Only the signal timing on the second control line 52 is illustrated in FIG. 11. As shown in FIG. 11, take the low level signal in which the second active level signal is a negative voltage as an example. The time period in which the second control line 52 provides the second active level signal includes a first time period t21, a second time period t22, and a third time period t23, the signal voltage value in the second time period t22 is less than the signal voltage value in the first time period t21, and the signal voltage value in the second time period t22 is less than the signal voltage value in the third time period t23; the signal voltage value in the third time period t23 and the signal voltage value in the first time period t21 may be the same or different. Such a setting makes the rate at which the voltage signal on the second control line 52 decreases from a high level to a low level slower, the second transistor T2 will be turned on relatively slowly, and the charging adequacy of the data line 10 which is connected to the second transistor T2 after the second transistor T2 is turned on will be reduced, whereby the dark-state voltage of the sub-pixel 20 connected to the data line 10 will be made larger. That is, it is possible to make the dark-state voltage of the second sub-pixel 22 and/or the dark-state voltage of the third sub-pixel 23 closer to the dark-state voltage of the first sub-pixel 21. And the dark-state voltage of one of the three sub-pixels will be used as the dark-state voltage of the display panel, so that the dark-state voltages of the three color sub-pixels are close to each other, and it can be easy to regulate and control the gray scale voltage of each color sub-pixel.

When the transistor T is an n-type transistor, the second active level signal is a high level signal of a positive voltage, then the signal voltage value in the second time period t22 is set to be greater than the signal voltage value in the first time period t21, and the signal voltage value in the second time period t22 is set to be greater than the signal voltage value in the third time period t23. As such, the second transistor T2 will be turned on relatively slowly, and the charging degree of the data line 10 which is connected to the second transistor T2 after the second transistor T2 is turned on is reduced, whereby the dark-voltage of the sub-pixel 20 connected to the data line 10 will be increased.

Figure 12:
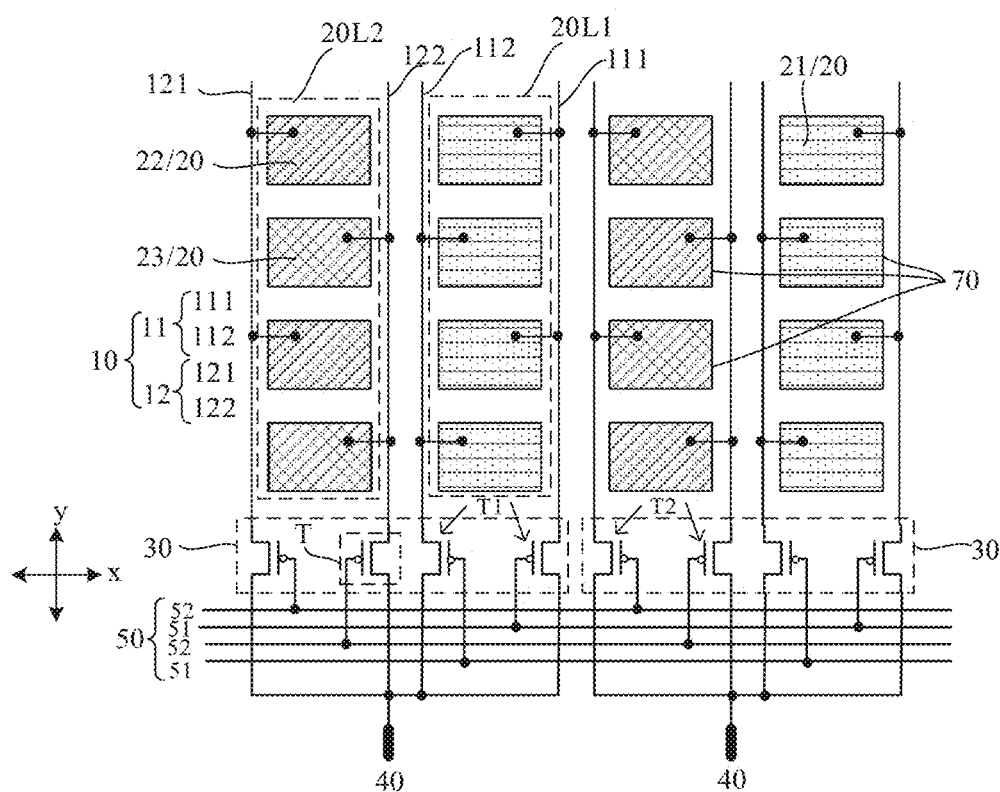
FIG. 12 is a schematic diagram of another display panel provided by an embodiment of the present disclosure.

In an embodiment, take n=4 as an example, and FIG. 12 is a schematic diagram of another display panel provided by an embodiment of the present disclosure. As shown in FIG. 12, the sub-pixels 20 include pixel circuits 70, and a plurality of the pixel circuits 70 of a plurality of the first sub-pixels 21 are arranged along the first direction y to form a first pixel column 20L1. The pixel circuits 70 of the second sub-pixels 22 and the pixel circuits 70 of the third sub-pixels 23 are alternately arranged along the first direction y as the second pixel column 20L2. The first pixel columns 20L1 and the second pixel columns 20L2 are alternately arranged along the second direction X, which crosses the first direction y. The data line 10 includes a first data line 11 and a second data line 12; the first data line 11 includes a first sub data line 111 and a second sub data line 112, the first sub data line 111 is coupled to the odd-numbered pixel circuits 70 in the first pixel column 20L1, and the second sub data line 112 is coupled to the even-numbered pixel circuits 70 in the first pixel column 20L1; the second data line 12 includes a third sub-data line 121 and a fourth sub-data line 122, the third sub-data line 121 is coupled to the pixel circuits 70 belonging to the second sub-pixels 22 in the second pixel column 20L2, and the fourth sub-data line 122 is coupled to the pixel circuits 70 belonging to the third sub-pixels 23 in the second pixel column 20L2; with n=4, the four transistors T in one demultiplexer 30 include two first transistors T1 and two second transistors T2, one of the two first transistors T1 is connected to the first sub-data line 111, and the other is connected to the second sub-data line 112; one of the two second transistors T2 is connected to the third sub-data line 121, and the other is connected to the fourth sub-data line 122. The control line 50 includes two first control lines 51 and two second control lines 52. The control terminals of the first transistors T1 are coupled to the first control lines 51, and the control terminals of the second transistors T2 are coupled to the second control lines 52. The display panel provided by the embodiment of FIG. 12 may adopt the designs in the above embodiments to reduce the dark-voltage of the first sub-pixel 21.

Figure 13:
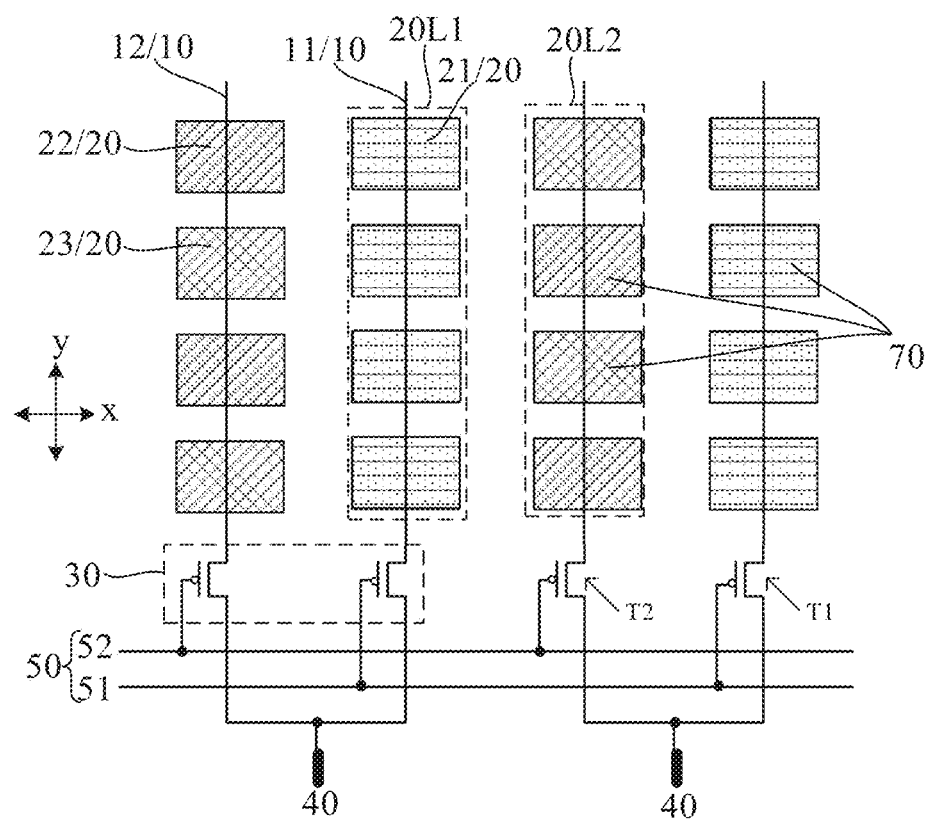
FIG. 13 is a schematic diagram of another display panel provided by an embodiment of the present disclosure.

In further embodiments, take n=2 as an example, and FIG. 13 is a schematic diagram of another display panel provided by an embodiment of the present disclosure. As shown in FIG. 13, a plurality of pixel circuits 70 of a plurality of first sub-pixels 21 are arranged in a first pixel column 20L1 along a first direction y, and the pixel circuits 70 of the second sub-pixels 22 and the pixel circuits 70 of the third sub-pixels 23 are alternately arranged along the first direction y as a second pixel column 20L2; a first data line 11 is electrically connected to the plurality of pixel circuits 70 in the first pixel column 20L1, and a second data line 12 is electrically connected to the plurality of pixel circuits 70 in the second pixel column 20L2; and the output ends of the multiplexer 30 are connected to one first data line 11 and one second data line 12. The multiplexer 30 includes a first transistor T1 and a second transistor T2. The control terminal of the first transistor T1 is connected to the first control line 51, and the control terminal of the second transistor T2 is connected to the second control line 52. The display panel provided by the embodiment of FIG. 13 may adopt the designs in the above embodiments to reduce the dark-state voltage of the first sub-pixel 21.

Figure 14:
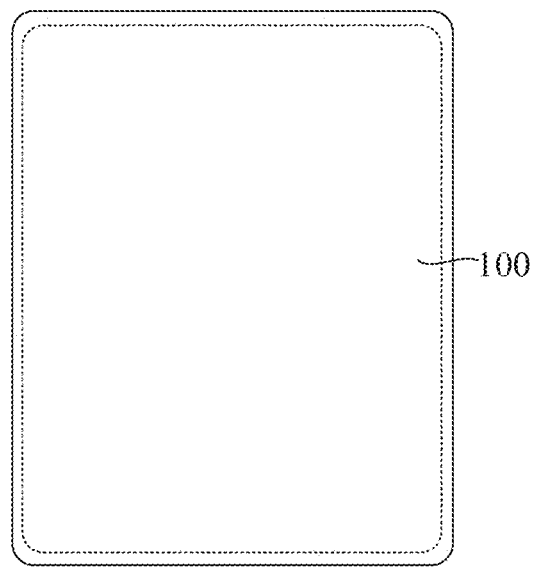
FIG. 14 is a schematic diagram of a display apparatus provided by an embodiment of the present disclosure.

An embodiment of the present disclosure further provides a display apparatus. FIG. 14 is a schematic diagram of the display apparatus provided by the embodiment of the present disclosure. As shown in FIG. 14, the display apparatus includes a display panel 100. The display panel 100 is any of the display panels provided by the embodiments of the present disclosure. The structure of the display panel 100 has been described in the above embodiments, and is not repeated here. The display apparatus provided by the embodiment of the present disclosure may be an electronic device such as a mobile phone, a tablet, a computer, a television, and the like.

Based on the same inventive concept, an embodiment of the present disclosure further provide a driving method for a display panel, which may be applied to the display panel provided by the embodiment as shown in FIG. 12 or FIG. 13. By using the driving method provided by the embodiment of the present disclosure, it is possible to make the first transistor T1 turned on better in a certain period of time, and to make the data voltage written into the first sub-pixel 21 more sufficient, whereby it is possible to reduce the dark-state voltage of the first sub-pixel 21, and in turn to improve the problems of the display panel, such as image smear, large power consumption, and the line crosstalk when the gray scale is switched to black.

In some implements, the driving method provided by the embodiment of the present disclosure includes: providing a first active level signal by one first control line 51 to control one first transistor T1 to be turned on; and providing a second active level signal by one second control line 52 to control one second transistor T2 to be turned on; where the absolute value of the voltage value of the first active level signal is greater than the absolute value of the voltage value of the second active level signal. By using the driving method provided by the embodiment of the present disclosure, it is possible to make the first transistor T1 turned on better, and thus the data voltage written into the data line 10 connected to the first transistor T1 is more sufficient, and the data voltage actually written into the first sub-pixel 21 is closer to a preset data voltage, whereby it is possible to reduce the preset data voltage required for the first sub-pixel 21 to reach the black-state. When the dark-state voltage of the display panel depends on the dark-state voltage of the first sub-pixel 21, the dark-state voltage of the display panel can be reduced by reducing the dark-state voltage of the first sub-pixel 21. After the dark-state voltage of the display panel is reduced, the amplitude of the jump of the voltage on the data line 10 is reduced when the grey scale of the sub-pixel 20 driven by the data line 10 is switched to black.

After the transistor T connected to the data line 10 is turned off, the data line 10 is in a floating state, the influence of the coupling effect caused by other signal lines on the voltage on the data line 10 is reduced accordingly, thereby reducing the line crosstalk between the data line 10 and other signal lines, and improving the display effect. In addition, the power consumption can be reduced by reducing the dark-state voltage of the display panel. On another aspect, the drift amount of the threshold voltage of the drive transistor of the pixel circuit can be reduced by reducing the dark-state voltage, thereby improving display brightness of the first frame when a frame rate is switched or a picture is switched, and improving the problem of image smear. In yet another aspect, the first transistor T1 is turned on better, such that the data voltage is more sufficiently written into the data line 10 connected to the first sub-pixels 21, and thus the grey scale displayed by the first sub-pixels 21 is more accurate. When the first sub-pixel 21 is a sub-pixel of the three sub-pixels 20 that has the highest percentage of brightness when they cooperate to emit white light, for example, when the first sub-pixel 21 is a green sub-pixel, the visual effect of the low gray scale display can also be enhanced.

Take the first transistor T1 and the second transistor T2 as p-type transistors as an example, and thus the active level signal is the low level signal. The driving method provided by an embodiment of the present disclosure will be understood in conjunction with FIG. 12 and FIG. 9. In the driving method provided by the embodiment of the present disclosure, the first active level signal is provided by the first control line 51 to control the first transistor T1 to be turned on, and the second active level signal is provided by the second control line 52 to control the second transistor T2 to be turned on. The voltage value of the first active level signal is less than the voltage value of the second active level signal.

When the first transistor T1 and the second transistor T2 are n-type transistors, the active level signal is high level, and thus in the driving method, the voltage value of the first active level signal is greater than the voltage value of the second active level signal.

Further, in the driving method provided by the embodiment of the present disclosure, the step of providing a second active level signal by one second control line 52 to control one second transistor T2 to be turned on includes: a time period in which the second active level signal is provided comprising a first time period, a second time period, and a third time period, the absolute value of the voltage value of the second active level signal in the second time period being greater than that in the first time period, and the absolute value of the voltage value of the second active level signal in the third time period being greater than that in the second time period. With the driving method provided by the embodiment of the present disclosure, the second transistor T2 is turned on more slowly. After the second transistor T2 is turned on, the sufficiency of the charging of the data line 10 connected to the second transistor T2 is reduced, whereby the dark-state voltage of the sub-pixels 20 connected to this data line 10 is increased. That is, it is possible to make the dark-state voltage of the second sub-pixels 22 and/or the dark-state voltage of the third sub-pixel 23 closer to the dark-state voltage of the first sub-pixel 21. The dark-state voltage of one of the first sub-pixel 21, the second sub-pixel 22, and the third sub-pixel 23 is taken as the dark-state voltage of the display panel, such that the dark-state voltages of the first sub-pixel 21, the second sub-pixel 22, and the third sub-pixel 23 are close, and it is possible to facilitate the regulation and controlling of the grey scale voltages of the first sub-pixel 21, the second sub-pixel 22, and the third sub-pixel 23.

It may be understood in conjunction with the embodiments shown in FIG. 1 and FIG. 11, the transistors T are p-type transistors, and the second active level signal is the low level signal with a negative voltage. The time period in which the second control line 52 provides the second active level signal includes a first time period t21, a second time period t22, and a third time period t23. The voltage value of the second active level signal in the second time period t22 is less than that in the first time period t21, and is also less than that in the third time period t23.

In addition, when the transistors T are n-type transistors, the second active level signal is a high level signal with a positive voltage. The voltage value of the second active level signal in the second time period t22 is larger than that in the first time period t21, and is also larger than that in the third time period t23.

Further, in the driving method provided by some embodiments of the present disclosure, the step of providing a first active level signal by one first control line 51 to control one first transistor T1 to be turned on includes: a duration of the first active level signal being t1, and the step of providing a second active level signal by one second control line 52 to control one second transistor T2 to be turned on includes: a duration of the second active level signal being $t_2$, wherein $t_1>t_2$. With the driving method, the turned-on time of the first transistor T1 can be increased, thereby being able to increase the charging time of the data line 10 connected to the first transistor T1. The data line 10 connected to the first transistor T1 is connected to a plurality of the first sub-pixels 21 correspondingly, whereby the dark-state voltage of the first sub-pixel 21 can be further reduced, to improve the problems such as display smear, large power consumption, and the line crosstalk when gray scale is switched to black of the display panel.

Based on the same inventive concept, an embodiment of the present disclosure further provide a display apparatus. The display apparatus includes a display panel. The display panel can be driven by using the driving method provided by any one of the embodiments of the present disclosure. The driving method has been described in the above embodiments and will not be described again. The display apparatus provided by the embodiment of the present disclosure may be an electronic device such as a mobile phone, a tablet, a computer, or a television, and the like.

The above description is merely for the preferred embodiments of the present disclosure, and is not intended to limit the present disclosure. Any modifications, equivalent replacements, improvements, and the like made within the spirit and principle of the present disclosure shall fall within the protection scope of the present disclosure.

Finally, it should be noted that the foregoing embodiments are merely intended to describe and not to limit the technical solutions of the present disclosure. Although the present disclosure has been described in detail with reference to the foregoing embodiments, those skilled in the art should understand that they can still make modifications to the technical solutions described in the foregoing embodiments or make equivalent replacements to some or all of the technical features thereof. These modifications or replacements do not make the essence of the corresponding technical solutions deviate from the scope of the technical solutions in the various embodiments of the present disclosure.

What is claimed is:

1. A display panel, comprising: data lines, sub-pixels, demultiplexers, data terminals, and control lines; wherein
   the sub-pixels comprise first sub-pixels, second sub-pixels, and third sub-pixels which are different from each other in color, and the data lines are coupled to a plurality of the sub-pixels;
   an input terminal of each demultiplexer is coupled to one of the data terminals, and output terminals of each demultiplexer are coupled to n data lines of the data lines, where n is a positive integer and n≥2; each demultiplexer comprises n transistors, each transistor is connected between the input terminal and one of the output terminals of the demultiplexer, and one transistor is connected to one corresponding data line, and a control terminal of each transistor is coupled to one of the control lines; and
   the n transistors comprise first transistors and second transistors, the data lines connected to the first transistors are coupled to a plurality of the first sub-pixels, and the data lines connected to the second transistors are coupled to a plurality of the second sub-pixels and/or a plurality of the third sub-pixels; the control lines comprise first control lines and second control lines, the control terminal of each first transistor is coupled to one first control line, and the control terminal of each second transistor is coupled to one second control line; and
   wherein each first control line comprises a first wiring section;
   a line width of the first wiring section is greater than a line width of each second control line; and/or
   the first wiring section comprises a first sub-wiring and a second sub-wiring arranged in different layers, and the first sub-wiring and the second sub-wiring are connected with each other by at least two vias.

2. The display panel of claim 1, wherein the first wiring section comprises at least one hollow out portion.

3. The display panel of claim 2, wherein the first sub-wiring comprises the at least one hollow out portion, and/or the second sub-wiring comprises the at least one hollow out portion.

4. The display panel of claim 2, wherein a direction of extension of the at least one hollow out portion is the same as a direction of extension of the first wiring section.

5. The display panel of claim 1, further comprising a display region and a non-display region, and wherein the data lines and the sub-pixels are located in the display region,
   the non-display region comprises a first area, a bendable area, and a second area, the first area is adjacent to the display region, the bendable area is located on a side of the first area away from the display region, and the second area is located on a side of the bendable area away from the first area;
   the demultiplexers are located in the first area, the data terminals are located in the second area, and the control lines extend from the second area into the first area.

6. The display panel of claim 5, wherein at least a part of the first wiring section is located in the second area.

7. The display panel of claim 1, wherein a width-to-length ratio of the first transistor is greater than a width-to-length ratio of the second transistor.

8. The display panel of claim 1, wherein each first control line provides a first active level signal to control one first transistor to be turned on, each second control line provides a second active level signal to control one second transistor to be turned on, and an absolute value of a voltage value of the first active level signal is greater than an absolute value of a voltage value of the second active level signal.

9. The display panel of claim 1, wherein each second control line provides a second active level signal to control one second transistor to be turned on; and a time period in which the second control line provides the second active level signal comprises a first time period, a second time period, and a third time period, an absolute value of a voltage value of the second active level signal in the second time period is greater than the absolute value of the voltage value of the second active level signal in the first time period, and the absolute value of the voltage value of the second active level signal in the second time period is greater than the absolute value of the voltage value of the second active level signal in the third time period.

10. The display panel of claim 1, wherein each first control line provides a first active level signal to control one first transistor to be turned on, and each second control line provides a second active level signal to control one second transistor to be turned on, a duration $t_1$ of the first active level signal is greater than a duration $t_2$ of the second active level signal.

11. The display panel of claim 1, wherein each sub-pixel comprises a pixel circuit, a plurality of the pixel circuits of a plurality of the first sub-pixels are arranged along a first direction to form a first pixel column, and the pixel circuits of the second sub-pixels and the pixel circuits of the third sub-pixels are alternately arranged along the first direction to form a second pixel column;

the data lines comprise first data lines and second data lines; the first data lines comprise a first sub data line and a second sub data line, the first sub data line is coupled to odd-numbered pixel circuits in the first pixel column, and the second sub data line is coupled to even-numbered pixel circuits in the first pixel column;

the second data lines comprise a third sub data line and a fourth sub data line, the third sub data line is coupled to the pixel circuits belonging to the second sub-pixels in the second pixel column, and the fourth sub data line is coupled to the pixel circuits belonging to the third sub-pixels in the second pixel column; and n=4, the n transistors comprise two first transistors and two second transistors, one of the two first transistors is connected to the first sub data line, the other of the two first transistors is connected to the second sub data line, one of the two second transistors is connected to the third sub data line, and the other of the two second transistors is connected to the fourth sub data line.

12. The display panel of claim 1, wherein the first sub-pixel is a green sub-pixel, one of the second sub-pixel and the third sub-pixel is a red sub-pixel, and the other of the second sub-pixel and the third sub-pixel is a blue sub-pixel.

13. A driving method for a display panel, wherein the display panel comprises: data lines, sub-pixels, demultiplexers, data terminals, and control lines; wherein the sub-pixels comprise first sub-pixels, second sub-pixels, and third sub-pixels which are different from each other in color, and the data lines are coupled to a plurality of the sub-pixels;

an input terminal of each demultiplexer is coupled to one of the data terminals, and output terminals of each demultiplexer are coupled to n data lines of the data lines, where n is a positive integer and n≥2; each demultiplexer comprises n transistors, each transistor is connected between the input terminal and one of the output terminals of the demultiplexer, and one transistor is connected to one corresponding data line, and a control terminal of each transistor is coupled to one of the control lines; and the n transistors comprise first transistors and second transistors, the data lines connected to the first transistors are coupled to a plurality of the first sub-pixels, and the data lines connected to the second transistors are coupled to a plurality of the second sub-pixels and/or a plurality of the third sub-pixels; the control lines comprise first control lines and second control lines, the control terminal of each first transistor is coupled to one first control line, and the control terminal of each second transistor is coupled to one second control line;

the driving method comprises:

providing a first active level signal by one first control line to control one first transistor to be turned on;

providing a second active level signal by one second control line to control one second transistor to be turned on; wherein an absolute value of a voltage value of the first active level signal is greater than an absolute value of a voltage value of the second active level signal.

14. The method of claim 13, wherein the providing a second active level signal by one second control line to control one second transistor to be turned on comprises:

a time period in which the second active level signal is provided comprising a first time period, a second time period, and a third time period, wherein an absolute value of a voltage value of the second active level signal in the second time period is greater than the absolute value of the voltage value of the second active level signal in the first time period, and the absolute value of the voltage value of the second active level signal in the second time period is greater than the absolute value of the voltage value of the second active level signal in the third time period.

15. The method of claim 13, wherein the providing a first active level signal by one first control line to control one first transistor to be turned on comprises: a duration of the first active level signal being $t_1$, the providing a second active level signal by one second control line to control one second transistor to be turned on comprises: a duration of the second active level signal being $t_2$, wherein $t_1 > t_2$.

16. A display apparatus comprising a display panel, wherein the display panel comprises: data lines, sub-pixels, demultiplexers, data terminals, and control lines; wherein the sub-pixels comprise first sub-pixels, second sub-pixels, and third sub-pixels which are different from each other in color, and the data lines are coupled to a plurality of the sub-pixels;

an input terminal of each demultiplexer is coupled to one of the data terminals, and output terminals of each demultiplexer are coupled to n data lines of the data lines, where n is a positive integer and n≥2; each demultiplexer comprises n transistors, each transistor is connected between the input terminal and one of the output terminals of the demultiplexer, and one transistor is connected to one corresponding data line, and a control terminal of each transistor is coupled to one of the control lines; and the n transistors comprise first transistors and second transistors, the data lines connected to the first transistors are coupled to a plurality of the first sub-pixels, and the data lines connected to the second transistors are coupled to a plurality of the second sub-pixels and/or a plurality of the third sub-pixels; the control lines comprise first control lines and second control lines, the control terminal of each first transistor is coupled to one first control line, and the control terminal of each second transistor is coupled to one second control line; and wherein each first control line comprises a first wiring section;

a line width of the first wiring section is greater than a line width of each second control line; and/or the first wiring section comprises a first sub-wiring and a second sub-wiring arranged in different layers, and the first sub-wiring and the second sub-wiring are connected with each other by at least two vias.

* * * * *